United States Patent
Wendling

(10) Patent No.: US 6,797,108 B2
(45) Date of Patent: Sep. 28, 2004

(54) APPARATUS AND METHOD FOR EVENLY FLOWING PROCESSING GAS ONTO A SEMICONDUCTOR WAFER

(75) Inventor: Thomas P. H. F. Wendling, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 439 days.

(21) Appl. No.: 09/972,544

(22) Filed: Oct. 5, 2001

(65) Prior Publication Data

US 2003/0198740 A1 Oct. 23, 2003

(51) Int. Cl.⁷ ........................ C23C 16/00; H01L 21/306; C23F 1/00
(52) U.S. Cl. ..................... 156/345.33; 118/715
(58) Field of Search ............... 118/715; 156/345.29, 156/345.33, 345.34

(56) References Cited

U.S. PATENT DOCUMENTS

| | | | |
|---|---|---|---|
| 3,854,443 A | 12/1974 | Baerg | 118/48 |
| 4,508,054 A * | 4/1985 | Baumberger et al. | 118/718 |
| 4,538,899 A * | 9/1985 | Landa et al. | 399/156 |
| 4,792,378 A | 12/1988 | Rose et al. | 156/643 |
| 4,949,669 A | 8/1990 | Ishii et al. | 118/733 |
| 5,174,825 A | 12/1992 | White, Jr. et al. | 118/715 |
| 5,455,070 A | 10/1995 | Anderson et al. | 427/248.1 |
| 5,498,909 A | 3/1996 | Hasunuma et al. | 257/754 |
| 5,595,602 A | 1/1997 | Harlan | 118/715 |
| 5,846,330 A * | 12/1998 | Quirk et al. | 118/723 DC |
| 5,855,681 A | 1/1999 | Maydan et al. | 118/19 |
| 5,901,271 A | 5/1999 | Benzing et al. | 392/387 |
| 5,911,834 A | 6/1999 | Fairbairn et al. | 134/1.3 |
| 5,954,878 A | 9/1999 | Mandal et al. | 118/319 |
| 5,968,593 A | 10/1999 | Sakamoto et al. | 427/248.1 |
| 6,064,800 A | 5/2000 | Sandhu | 392/416 |
| 6,068,738 A | 5/2000 | Bjornard et al. | 201/192.12 |
| 6,086,677 A | 7/2000 | Umotoy et al. | 118/715 |
| 6,090,211 A | 7/2000 | Kamei et al. | 118/725 |
| 6,098,843 A | 8/2000 | Soberanis et al. | 222/53 |
| 6,183,563 B1 | 2/2001 | Choi et al. | 118/715 |
| 6,197,121 B1 | 3/2001 | Gurary et al. | 118/725 |
| 6,428,847 B1 * | 8/2002 | Grant et al. | 427/248.1 |
| 6,432,259 B1 * | 8/2002 | Noorbakhsh et al. | 156/345.33 |
| 2003/0198740 A1 * | 10/2003 | Wendling | 427/248.1 |

FOREIGN PATENT DOCUMENTS

| | | | |
|---|---|---|---|
| JP | 62-051211 A | * | 3/1987 |
| JP | 03-166377 A | * | 7/1991 |
| WO | WO 03/031678 A1 | * | 4/2003 |

* cited by examiner

Primary Examiner—Jeffrie R. Lund
(74) Attorney, Agent, or Firm—Ostroff & Associates

(57) ABSTRACT

A semiconductor processing apparatus with a chamber, a wafer holder and a processing gas inlet pipe is provided with an impeller fixed within the inlet pipe. As gas flows through slots in the impeller, the gas is directed into a plurality of generally horizontal streams beneath the impeller which cause a swirling whirlpool-like motion of the gas in a lower portion of the pipe. As the swirling gas flows out of an exit-end of the pipe, centrifugal forces cause the gas immediately to flow outward within the chamber so that on passing down onto a wafer the gas flows uniformly across a surface of the wafer.

11 Claims, 2 Drawing Sheets

APPARATUS AND METHOD FOR EVENLY FLOWING PROCESSING GAS ONTO A SEMICONDUCTOR WAFER

FIELD OF THE INVENTION

This invention relates to a system for evenly spreading within a semicondcutor processing chamber gas, particularly such gases as used in chemical vapor deposition (CVD) of very thin layers of material uniformly over and across the surfaces of large diameter wafers.

BACKGROUND OF THE INVENTION

This invention relates to a system for evenly spreading within a semicondcutor processing chamber gas, particularly such gases as used in chemical vapor deposition (CVD) of very thin layers of material uniformly over and across the surfaces of large diameter wafers.

In chemical vapor deposition (CVD) of material onto semiconductor wafers, a processing gas or gases are admitted into a sealed chamber (a process well known in the art) to insure even deposition of material onto a wafer, which is held in position on a platform within the chamber, the processing gas should be distributed as it flows into the chamber so that the gas flows uniformly onto and over the wafer. Thus a layer of solid material being deposited on the wafer is even and uniform across the wafer. As wafers of larger and larger diameter (e.g., 300 mm), and much greater device density (e.g., line widths of 170 nanometers or finer) become standard, it is more important than ever that processing gas flow onto and over the wafers be as nearly perfect in uniformity as possible.

Various ways of evenly distributing processing gas have been used in the past. One commonly used way is to flow the gas through "a shower head" located at the gas inlet to the chamber. A disadvantage of such an arrangement is that it tends to be bulky and costly. Moreover, fine holes through the shower head tend to clog and must be cleaned frequently. The present invention provides a simple and efficient way of obtaining uniformity of gas flow.

SUMMARY OF THE INVENTION

The present invention, in one aspect, provides a mechanical device, termed herein an impeller, in an inlet gas passageway leading into a wafer processing chamber. The impeller, which is stationary, imparts a spinning or whirlpool-like flow to the processing gas within a lower portion of the passageway so that as the spinning gas flows out of the passageway and enters the chamber, centrifugal forces impart radial movement to the gas flow along with downward movement into the chamber. This combined radial and downward movement helps facilitate relatively uniform distribution of gas onto and over a wafer being processed. The impeller has fixed, fan-like blades which overlap. A slight tilt of the blades provides a slot between a front edge of one blade and a back edge of the next one, and so on. Thus gas flowing down and through the slots between the blades into the lower portion of the passageway has a spinning, or whirlpool-like motion imparted to it.

(Claim 1) Viewed from a first apparatus aspect, the present invention is a semiconductor processing apparatus comprising a chamber, a wafer support member within the chamber, a gas inlet pipe for flowing processing gas down into a top part of the chamber at an exit-end of the pipe; and an impeller mounted within the pipe above the exit-end thereof, the impeller directing the gas flowing down within the pipe into a plurality of lateral secondary gas streams rotating beneath the impeller to cause a swirling whirlpool-like motion of the gas.

Viewed from a second apparatus aspect, the present invention is semiconductor apparatus useful to control processing gas flowing onto a wafer held within the chamber. The apparatus comprises. The apparatus comprises a chamber having an upper portion and a lower portion, a platform for holding a wafer for the processing thereof within the chamber, a gas pipe for flowing processing gas down through an exit-end thereof into the upper portion of the chamber, and an impeller. The comprises a plurality of fan-like blades radiating from a center to an outer rim. Thee blades are circumferentially spaced and overlap each other with a front edge of one blade being beneath and ahead of a rear edge of the next blade and so on. There are respective spaces between the blades where they overlap. The spaces between the blades forming secondary gas passageways for directing respective streams of gas laterally beneath the impeller into a rotational swirling motion. The impeller is fixed within the gas pipe above its exit-end such that when the swirling gas beneath the impeller flows into the upper portion of the chamber internal forces cause the gas to flow outward across the chamber and then down evenly onto and over a wafer on the platform.

Viewed from a method aspect, the invention is a method of evenly spreading processing gas onto and over the surface of a semiconductor wafer. The method comprising the steps of: flowing a stream of processing gas in a pipe downward toward a wafer being held in a chamber; generating a whirlpool-like laterally swirling motion in the gas stream; and using internal forces within the swirling gas to cause it on entering the chamber to flow immediately outward within the chamber and then down evenly onto and over a wafer within the chamber.

A better understanding of the invention together with a fuller appreciation of its many advantages will best be gained from a study of the following description given in conjunction with the accompanying drawings and claims.

The drawings are not to scale.

DETAILED DESCRIPTION

Figure 1:
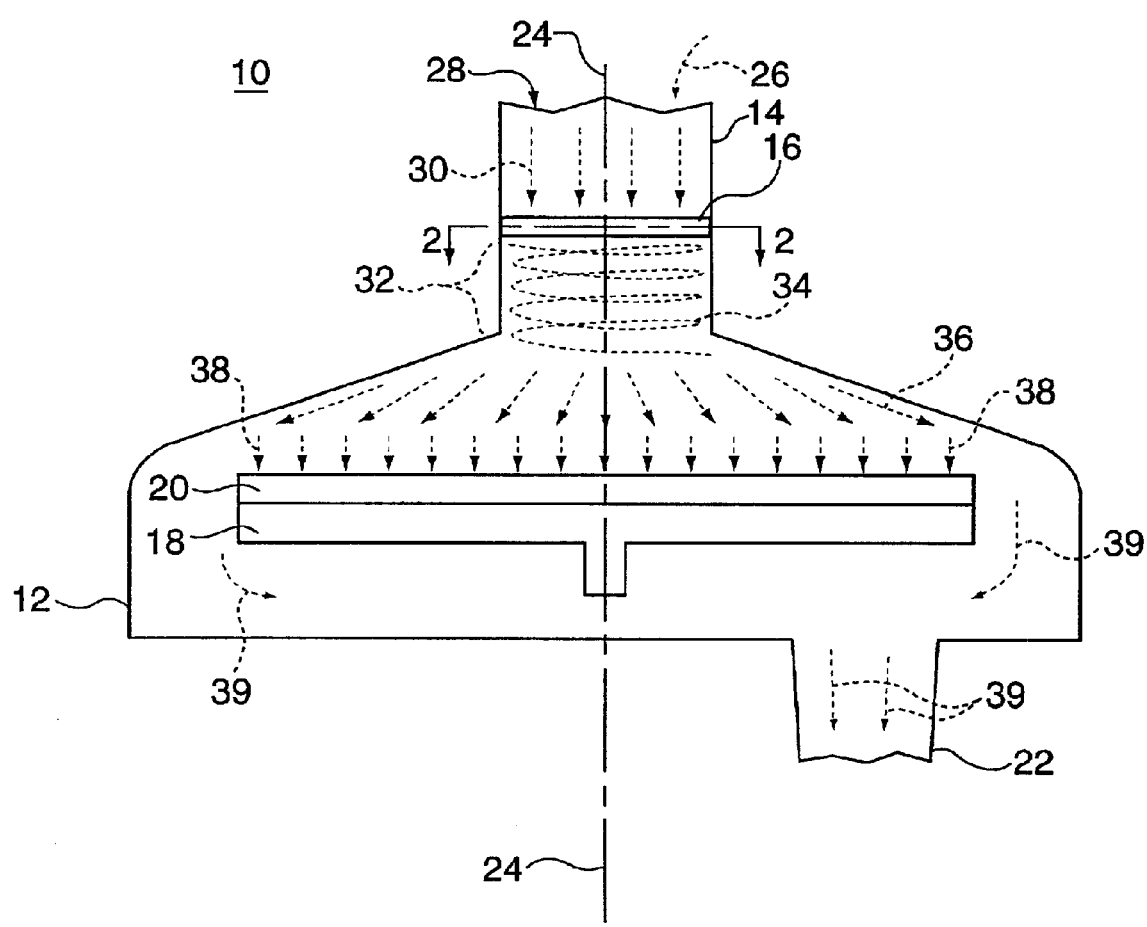
FIG. 1 is a schematic illustration of a semiconductor wafer processing apparatus embodying features of the invention.

Referring now to FIG. 1, there is shown in schematic form and partially broken away an apparatus 10 embodying features of the invention. The apparatus 10 includes a wafer processing chamber 12, a gas inlet pipe 14, an impeller 16 fixed within the pipe 14, a wafer-holder (platform, wafer support member) 18 beneath the inlet pipe 14, a semiconductor wafer 20 positioned on the platform 18, and an exhaust pipe 22. The apparatus 10, portions of which are not shown, is of a general type will known in the art with the exception of the novel impeller 16. This apparatus 10 is suited for the chemical vapor deposition (CVD) at subatmospheric pressure of very thin films of solid materials onto the exposed surfaces of semiconductor wafers of large diameter (e.g., 300 mm).

The chamber 12 has a vertical center axis 24 with which the inlet pipe 14, the impeller 16, the platform 18, and the wafer 20 are aligned. Processing gas is supplied to the apparatus 10 from a source indicated by an arrow 26 and flows inside a passageway 28 down within the gas pipe 14 as indicated by arrows 30. When this gas reaches the impeller 16, which is fixed within the pipe 14, the gas passes through the impeller 16 and is forced into a swirling or whirlpool-like motion, as is indicated by a bracket 32, within a lower portion of the pipe 14. As the swirling gas flows out of an exit-end 34 of the pipe 14, centrifugal forces cause the gas to immediately flow outward and down into the chamber 12, as indicated by arrows 36. Upon reaching the wafer 20, the gas has been spread uniformly across the chamber 12 so that the gas then flows evenly down upon and over the wafer 20, as indicated by arrows 38. Used processing gas is exhausted from the chamber 12 by the exhaust pipe 22, as indicated by arrows 39. In this way large diameter wafers (e.g., 300 mm) are able to have thin layers of solid material uniformly deposited across their exposed surfaces.

Figure 2:
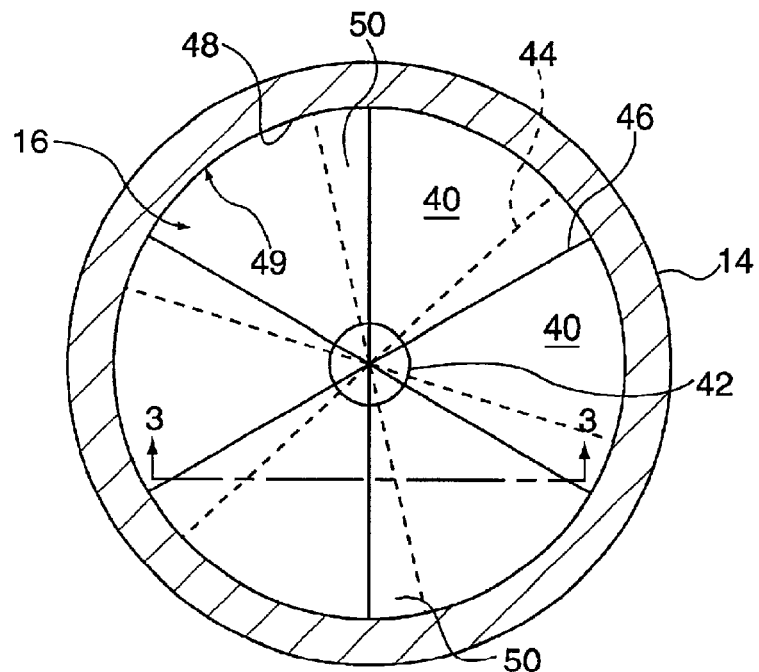
FIG. 2 is a plan view, taken as indicated by a dashed line 2—2 in FIG. 1, of an impeller provided by the invention to effect even flow of processing gas down and across a semiconductor wafer.

Referring now to FIG. 2, there is shown a top plan view of the impeller 16 (not to scale). In an illustrative embodiment, the impeller 16 has six fan-like blades 40 which radiate horizontally from a center 42 where they are joined together. Center 42 is aligned with the vertical axis 24. The blades 40 overlap each other with a front edge 44 of one blade lying under and ahead of the rear edge 46 of the next blade, and so on. Outer rims 48 of the blades 40 are fixed against and supported by an inside wall 49 of the pipe 14. The blades 40 are generally flat and are respectively tilted or rotated slightly around horizontal radii extending from the center 42. Thus, a front edge 44 of one blade lies a short distance below and ahead of a rear edge 46 of the next blade, and so on. In this way narrow, radially extending slots 50, which are circumferentially spaced, are formed in the impeller 16 by the overlapping blades 40, the number of slots 50 corresponding to the number of blades 40. Processing gas flows down through the slots 50 and is forced by the overlapping blades 40 into a rotational or swirling motion below the impeller 16, as indicated by the bracket 32 in FIG. 1, and as is described below.

Figure 3:
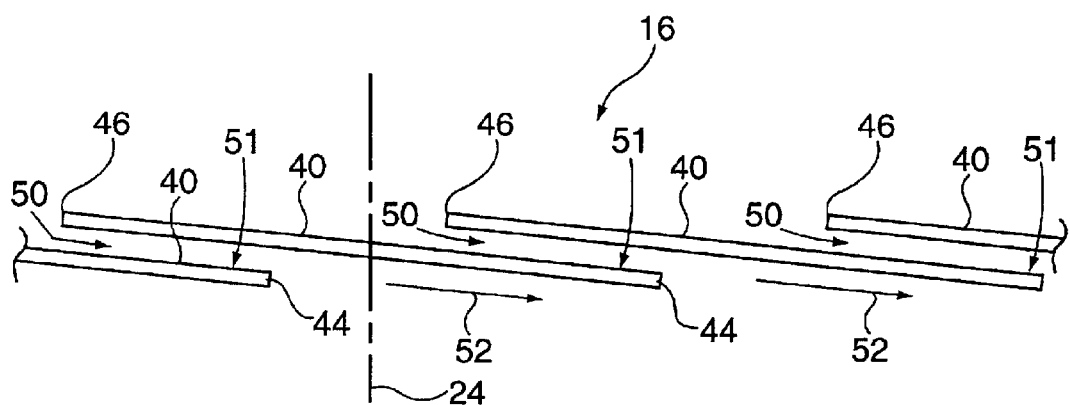
FIG. 3 is an enlarged cross-section of a portion of the impeller taken as indicated by a dashed line 3—3 in FIG. 2.

Referring now to FIG. 3, which is an enlarged cross section, partially broken away, of the impeller 16, the height of the slots 50 between the overlapping blades 40 is determined by the degree of tilt from horizontal of the respective blades 40. The impeller 16 is fixed at right-angles athwart the gas stream in the pipe 14 and processing gas flowing axially downward onto the impeller 16 flows through the slots 50. The slots 50 serve as respective entrances to secondary gas passageways 51 formed by the overlapping portions (between the edges 44 and 46) of the blades 40. These secondary passageways 51 direct the gas into separate generally horizontal gas jet streams 52 flowing laterally and rotationally beneath the impeller 16. As the swirling gas (indicated by the bracket 32 in FIG. 1) leaves the exit-end 34 of the pipe 14 and enters the chamber 12, rotational vectors of the gas cause it, by centrifugal force, to flow radially outward within the chamber, and downward vectors simultaneously cause the gas to flow downward. Thus the processing gas flows in the chamber 12 evenly all the way across a wafer 20 positioned on the platform 18. After passing over the wafer 20, used processing gas is exhausted from a lower end of the chamber by the exhaust pipe 22. The degree of tilt of the blades 40 and the overlap of the blade edges 44 and 45 are adjusted as desired for various operating conditions such as pressures, flow rates, and kinds of processing gas being used in the apparatus 10. The impeller 16 is advantageously made of an aluminum alloy of suitable strength and thickness.

The above description is intended in illustration and not in limitation of the invention. Various changes or modifications in the embodiment illustrated may occur to those skilled in the art and may be made without departing from the spirit or scope of the invention as described or as defined by the appended claims. For example, the number of blades 40 in the impeller 16 is not limited to the number shown, and the material of the impeller 16 may be other than aluminum alloy.

What is claimed is:

1. A semiconductor processing apparatus comprising;
   a chamber;
   a wafer support member within the chamber;
   a gas inlet pipe for flowing processing gas down into a top part of the chamber at an exit-end of the pipe; and
   a fixed disc-shaped impeller comprising a plurality of fan-like blades which partly overlap each other, said impeller mounted within the pipe above the exit-end thereof, the impeller directing the gas flowing down within the pipe into a plurality of lateral secondary gas streams rotating beneath the impeller to cause a swirling whirlpool-like motion of the gas.

2. The apparatus of claim 1 wherein the swirling gas flows into the top part of the chamber.

3. The apparatus of claim 2 wherein centrifugal forces cause the swirly gas to flow outward across the chamber so that on passing down onto a wafer on the holder the gas flows uniformly across an exposed surface of the wafer.

4. The apparatus of claim 1 wherein the blades radiate from a center to an outer rim and are fixed in the pipe at right angles athwart the gas stream above the exit-end of the pipe.

5. The apparatus of claim 4 wherein the blades are spaced apart where they overlap such that a plurality of streams of processing gas flow between the blades and are directed into a swirling motion.

6. The apparatus of claim 1 wherein the apparatus has a central vertical axis and the chamber, and the wafer support member, and the gas inlet pipe are aligned along this axis along with the center of the impeller.

7. The apparatus of claim 1 further comprising a gas exhaust pipe for removing used processing gas from a lower portion of the chamber beneath the wafer support member.

8. Semiconductor apparatus useful to control processing gas flowing onto a wafer held within the chamber, the apparatus comprising:
   a chamber having an upper portion and a lower portion;
   a platform for holding a wafer for the processing thereof within the chamber;
   a gas pipe for flowing processing gas down through an exit-end thereof into the upper portion of the chamber; and
   an impeller which comprises a plurality of fan-like blades radiating from a center to an outer rim, the blades being circumferentially spaced and overlapping each other with a front edge of one blade being beneath and ahead of a rear edge of the next blade and so on, there being respective spaces between the blades where they overlap, the spaces between the blades forming secondary gas passageways for directing respective streams of gas laterally beneath the impeller into a rotational swirling motion, the impeller being fixed within the gas pipe above its exit-end, such that when the swirling gas beneath the impeller flows into the upper portion of the chamber internal forces cause the gas to flow outward across the chamber and then down evenly onto and over a wafer on the platform.

9. The apparatus of claim 8 wherein the blades of the impeller are generally flat and are tilted sufficiently to provide the spaces between the overlapping portions of the blades, inner ends of the blades being joined at a center, outer rims of the blades being fixed within the gas pipe such that the impeller is athwart the gas flow at right angles thereto.

10. The apparatus of claim 8 wherein there is a vertical center axis with which the gas pipe, the chamber, and the platform are aligned along with the center of the impeller.

11. The apparatus of claim 8 further comprising an exhaust pipe adjacent the lower portion of the chamber for removing used processing gas.

* * * * *